(12) United States Patent
Morisawa et al.

(10) Patent No.: US 9,845,531 B2
(45) Date of Patent: Dec. 19, 2017

(54) SUBSTRATE PROCESSING SYSTEM

(71) Applicant: Tokyo Electron Limited, Tokyo (JP)

(72) Inventors: Daisuke Morisawa, Yamanshi (JP); Junichi Ogawa, Yamanshi (JP)

(73) Assignee: Tokyo Electron Limited, Tokyo (JP)

( * ) Notice: Subject to any disclaimer, the term of this patent is extended or adjusted under 35 U.S.C. 154(b) by 705 days.

(21) Appl. No.: 14/455,795

(22) Filed: Aug. 8, 2014

(65) Prior Publication Data
US 2015/0040828 A1    Feb. 12, 2015

(30) Foreign Application Priority Data

Aug. 9, 2013    (JP) .................................. 2013-166260

(51) Int. Cl.
    C23C 16/44        (2006.01)
    H01L 21/67        (2006.01)

(52) U.S. Cl.
    CPC .... C23C 16/4401 (2013.01); H01L 21/67276 (2013.01)

(58) Field of Classification Search
    None
    See application file for complete search history.

(56) References Cited

U.S. PATENT DOCUMENTS

| | | | |
|---|---|---|---|
| 5,314,509 A * | 5/1994 | Kato | B01J 3/006 134/902 |
| 5,551,165 A * | 9/1996 | Turner | F26B 5/14 134/902 |

(Continued)

FOREIGN PATENT DOCUMENTS

| | | |
|---|---|---|
| JP | H05-003174 A | 8/1993 |
| JP | 2002-313789 A | 10/2002 |

(Continued)

OTHER PUBLICATIONS

Katou, Yoshitake; Vapor-Phase Growth Apparatus, Processing Method Thereof, Method of Forming Thin Film, and Program; Abstract for JP2006-351655; Dec. 28, 2006; http://www19.ipdl.inpit.go.jp/.

(Continued)

*Primary Examiner* — Isaac T Tecklu

(57) ABSTRACT

A substrate processing system for sequentially processing substrates includes processing chambers, a transfer unit, and a control unit controlling the processing chambers and the transfer unit. The control unit includes a transfer control unit controlling an operation of the transfer unit, a transfer order setting unit setting a transfer order of substrates to the processing chambers, an accumulation unit for accumulating a film thickness of a formed thin film or the number of processed substrates after completion of previous cleaning or previous pre-coating in the processing chambers, a processing chamber priority determination unit for determining priority of processing the substrates in the processing chambers based on predetermined rules, and an execution instruction unit for executing conditioning in the processing chambers. The control unit prevents the substrates from being simultaneously processed in all processing chambers during one cycle of executing conditioning once in each of the processing chambers.

12 Claims, 11 Drawing Sheets

(56) References Cited

U.S. PATENT DOCUMENTS

| | | | | |
|---|---|---|---|---|
| 5,565,034 | A * | 10/1996 | Nanbu | H01L 21/67173 118/319 |
| 6,650,409 | B1 * | 11/2003 | Morioka | G01N 21/9501 356/237.3 |
| 7,028,565 | B2 * | 4/2006 | Birkner | H01L 21/67161 73/865.8 |
| RE39,775 | E * | 8/2007 | Kato | C23C 14/564 34/406 |
| 2003/0045131 | A1 * | 3/2003 | Verbeke | H01L 21/67069 438/795 |
| 2005/0058446 | A1 * | 3/2005 | Plug | G03F 7/70533 396/611 |
| 2006/0280868 | A1 * | 12/2006 | Kato | C23C 16/52 427/248.1 |
| 2009/0269171 | A1 * | 10/2009 | Iijima | H01L 21/67253 414/222.01 |
| 2010/0009079 | A1 * | 1/2010 | Yamazaki | C23C 16/405 427/255.28 |
| 2012/0251704 | A1 * | 10/2012 | Chino | C23C 16/00 427/8 |
| 2015/0140786 | A1 * | 5/2015 | Kwak | H01L 31/18 438/478 |

FOREIGN PATENT DOCUMENTS

| | | |
|---|---|---|
| JP | 2003-277935 | 10/2003 |
| JP | 2006-351655 | 12/2006 |
| JP | 2012-216852 A | 11/2012 |

OTHER PUBLICATIONS

Atsushi, Denda; Plasma Treatment Method, System for Judging Cleaning, System for Selecting Cleaning Recipe, Program, and Information Memory Medium; Abstract for JP2003-277935; Oct. 2, 2003; http://www19.ipdl.inpit.go.jp/.

* cited by examiner

| PROCESS MODULE | | | |
|---|---|---|---|
| PM10A | PM10B | PM10C | PM10D |
| C | 500 | 334 | 167 |
| 167 | C | 500 | 334 |
| 334 | 167 | C | 500 |
| 500 | 334 | 167 | C |

FIG. 7A

| SECTION | PROCESS MODULE | | | |
|---|---|---|---|---|
| | PM10A | PM10B | PM10C | PM10D |
| 1 | 0 | 0 | 0 | 0 |
| 2 | 250 | 250 | 250 | 0 |
| 3 | 425 | 425 | 250 | 175 |
| 4 | 500 | 425 | 325 | 250 |
| 5 | C | 500 | 400 | 325 |
| 6 | C | C | 492 | 417 |
| 7 | 14 | C | 505 | 431 |
| 8 | 75 | C | C | 492 |
| 9 | 85 | 9 | C | 501 |
| 10 | 181 | 105 | C | C |
| 11 | 252 | 176 | 71 | C |
| 12 | 362 | 287 | 253 | 0 |
| 13 | 495 | 420 | 253 | 134 |
| 14 | 503 | 420 | 261 | 143 |
| 15 | C | 504 | 344 | 226 |
| 16 | C | C | 428 | 310 |
| 17 | 78 | C | 505 | 387 |
| 18 | 84 | C | C | 393 |
| 19 | 197 | 113 | C | 505 |
| 20 | 245 | 161 | C | C |
| 21 | 364 | 280 | 119 | C |
| 22 | 496 | 412 | 252 | 0 |
| 23 | 504 | 420 | 252 | 9 |
| 24 | C | 503 | 336 | 92 |
| 25 | C | C | 419 | 176 |
| 26 | 84 | C | 503 | 259 |
| 27 | 87 | 0 | 505 | 261 |
| 28 | 254 | 167 | C | 428 |
| 29 | 329 | 242 | 0 | 502 |
| 30 | 496 | 409 | 167 | C |

FIG. 7B

| SECTION | PROCESS MODULE | | | |
|---|---|---|---|---|
| | PM10A | PM10B | PM10C | PM10D |
| 31 | 504 | 417 | 175 | 0 |
| 32 | C | 500 | 258 | 84 |
| 33 | C | C | 342 | 167 |
| 34 | 83 | C | 425 | 251 |
| 35 | 161 | 0 | 502 | 329 |
| 36 | 328 | 167 | C | 496 |
| 37 | 336 | 175 | 0 | 504 |
| 38 | 503 | 342 | 167 | C |
| 39 | C | 500 | 325 | 158 |
| 40 | C | C | 334 | 167 |
| 41 | 158 | C | 492 | 325 |
| 42 | 169 | 0 | 503 | 336 |
| 43 | 336 | 167 | C | 502 |
| 44 | 502 | 334 | 167 | C |
| 45 | C | 500 | 334 | 167 |
| 46 | 167 | C | 500 | 334 |
| 47 | 334 | 167 | C | 500 |
| 48 | 500 | 334 | 167 | C |

FIG.11

| SECTION | PROCESS MODULE | | | |
|---|---|---|---|---|
| | PM10A | PM10B | PM10C | PM10D |
| 1 | 0 | 0 | 0 | 0 |
| 2 | 7 | 6 | 6 | 6 |
| 3 | C | 173 | 173 | 173 |
| 4 | 6 | 179 | 179 | 179 |
| 5 | 173 | C | 346 | 346 |
| 6 | 179 | 6 | 352 | 352 |
| 7 | 329 | 156 | C | 502 |
| 8 | 346 | 173 | C | C |
| 9 | 496 | 323 | 150 | C |
| 10 | 500 | 327 | 154 | 4 |
| 11 | C | 494 | 321 | 171 |
| 12 | 6 | 500 | 327 | 177 |
| 13 | 173 | C | 494 | 344 |
| 14 | 179 | 6 | 500 | 350 |
| 15 | 329 | 156 | C | 500 |
| 16 | 346 | 173 | C | C |
| 17 | 496 | 323 | 150 | C |
| 18 | 500 | 327 | 154 | 4 |
| 19 | C | 494 | 321 | 171 |
| 20 | 6 | 500 | 327 | 177 |
| 21 | 173 | C | 494 | 344 |
| 22 | 179 | 6 | 500 | 350 |
| 23 | 329 | 156 | C | 500 |

SUBSTRATE PROCESSING SYSTEM

CROSS-REFERENCE TO RELATED APPLICATION

This application claims priority to Japanese Patent Application No. 2013-166260 filed on Aug. 9, 2013, the entire contents of which are incorporated herein by reference.

FIELD OF THE INVENTION

The present invention relates to a substrate processing system for performing predetermined treatment on a substrate such as a semiconductor wafer or the like.

BACKGROUND OF THE INVENTION

In a semiconductor device manufacturing process, various treatments such as film formation, etching and the like are repeatedly performed on a substrate such as a semiconductor wafer or the like. In a semiconductor device manufacturing apparatus, a substrate processing system including a plurality of processing chambers is used. This substrate processing system includes one or more transfer units in order to carry out the transfer of a substrate within the system, e.g., between the processing chambers, and the transfer of a substrate to and from another substrate processing system.

Meanwhile, in the substrate processing system, as the treatment is repeated, reaction products are deposited on components or an inner wall of the processing chamber where the treatment such as film formation or the like is performed. The deposits are peeled off and become particles. The particles are adhered onto the substrate, so that the quality of the product deteriorates.

In order to remove the deposits, it is required to clean the inside of the processing chamber. For example, the processing chamber in which film formation is performed is cleaned by supplying a cleaning gas such as $ClF_3$ gas, $NF_3$ gas, $Cl_2$ gas or the like into the processing chamber. After the cleaning is performed, pre-coating for depositing a thin film in the processing chamber is performed so that a following process can be performed under the same processing conditions. The combination of the cleaning and the pre-coating performed after the cleaning is referred to as "conditioning". By performing the conditioning at a regular interval, the generation of particles can be prevented. The timing of executing the conditioning in the respective processing chambers of the substrate processing system varies in accordance with film forming conditions.

As for a method for controlling execution timing of the cleaning in the processing chamber, there has been proposed a method for detecting a contamination state of a processing chamber and determining whether or not cleaning needs to be executed based on a predetermined condition (e.g., Japanese Patent Application Publication No. 2003-277935).

In addition, there has been proposed a method that counts the number of execution of film formation in the processing chamber and performs pre-coating in the processing chamber when the number of execution of film formation exceeds a predetermined number so that the frequency of cleaning in the processing chamber can be reduced (e.g., Japanese Patent Application Publication No. 2006-351655).

In a multi-chamber type substrate processing system including a plurality of processing chambers, the conditioning is executed at different timings in the respective processing chambers. For example, in the processing chamber where film formation is performed, the conditioning is generally executed when the accumulated number of processed substrates or an accumulated film thickness reaches a predetermined level or when a contamination state is detected. Therefore, the execution timing of the conditioning is different in the respective processing chambers.

However, the state in which substrates in all processing chambers of the substrate processing system are simultaneously processed (hereinafter, may be referred to as "simultaneous use state of all processing chambers") is continued for a long period of time, the transfers of substrates by transfer units cannot be carried out at desired timings. As a consequence, an idle time occurs in the processing chambers, and the productivity deteriorates.

For example, if the execution timing of the conditioning is the same in all processing chambers, the production in the substrate processing system is stopped for several hours.

SUMMARY OF THE INVENTION

In view of the above, the present invention provides a multi-chamber type substrate processing system including a plurality of processing chambers, capable of improving a processing efficiency of the entire system by controlling the number of processing chambers where substrate are processed and the number of processing chambers where conditioning is executed.

In accordance with a first aspect of the present invention, there is provided a substrate processing system for sequentially processing a plurality of substrates, including: a plurality of processing chambers configured to perform a process on the substrates; a transfer unit configured to transfer the substrates to the processing chambers; and a controller configured to control the processing chambers and the transfer unit, wherein the control unit includes: a transfer control unit configured to control an operation of the transfer unit; a transfer order setting unit configured to set a transfer order of substrates to the processing chambers; an accumulation unit for accumulating a film thickness of a formed thin film or the number of processed substrates after completion of previous cleaning or previous pre-coating in each of the processing chambers; a processing chamber priority determination unit for determining priority of processing the substrates in the processing chambers based on predetermined rules; and an execution instruction unit for executing conditioning in each of the processing chambers.

The control unit of the substrate processing system of the first aspect of the present invention prevents the substrates from being simultaneously processed in all processing chambers during one cycle of executing conditioning once in each of the processing chambers.

In accordance with a second aspect of the present invention, there is provided a substrate processing system for sequentially processing a plurality of substrates, including: a plurality of processing chambers configured to perform the same type of processing on the substrates; a transfer unit configured to transfer the substrates to the processing chambers; and a controller configured to control the processing chambers and the transfer unit, wherein the control unit includes: a transfer control unit configured to control an operation of the transfer unit; a transfer order setting unit configured to set a transfer order of substrates to the processing chambers; an accumulation unit for accumulating a film thickness of a formed thin film or the number of processed substrates after completion of previous cleaning or previous pre-coating in each of the processing chambers; a processing chamber priority determination unit for determining priority of processing the substrates in the processing chambers based on predetermined rules; and an execution instruction unit for executing conditioning in each of the processing chambers, wherein, on the assumption that the number of processing chambers usable in the substrate processing system is n (n being a positive integer) and a maximum number of substrates contained in one lot is 25, the control unit performs control such that the number of substrates that are processed in each of the processing chambers in the simultaneous use state of all processing chambers does not exceed 25/n (here, rounded up after decimal point) during one cycle of executing conditioning once in each of the processing chambers.

In accordance with the present invention, the processing efficiency in the multi-chamber type substrate processing system including a plurality of processing chambers can be improved by controlling the number of processing chambers where substrates are processed and the number of processing chambers where conditioning is executed. Specifically, in the present invention, it is controlled such that the simultaneous use state of all processing chambers, i.e., the state in which substrates are simultaneously processed in all processing chambers, does not occur during one cycle of executing the conditioning once in each of the processing chambers or such that the number of substrates processed in the simultaneous use state of all processing chambers does not exceed 25/n (here, rounded up after decimal point). Hence, a throughput in the substrate processing system can be greatly improved.

BRIEF DESCRIPTION OF THE DRAWINGS

The objects and features of the present invention will become apparent from the following description of embodiments, given in conjunction with the accompanying drawings, in which:

FIGS. 7A and 7B show steps of repeating processing of substrates and conditioning of the process module based on rules in the first embodiment;

FIG. 11 shows a sequence of repeating processing of substrates and conditioning of the process module based on rules in a second embodiment of the present invention.

DETAILED DESCRIPTION OF THE EMBODIMENTS

Hereinafter, embodiments of the present invention will be described in detail with reference to the accompanying drawings which form a part hereof.

(First Embodiment)

Figure 1:
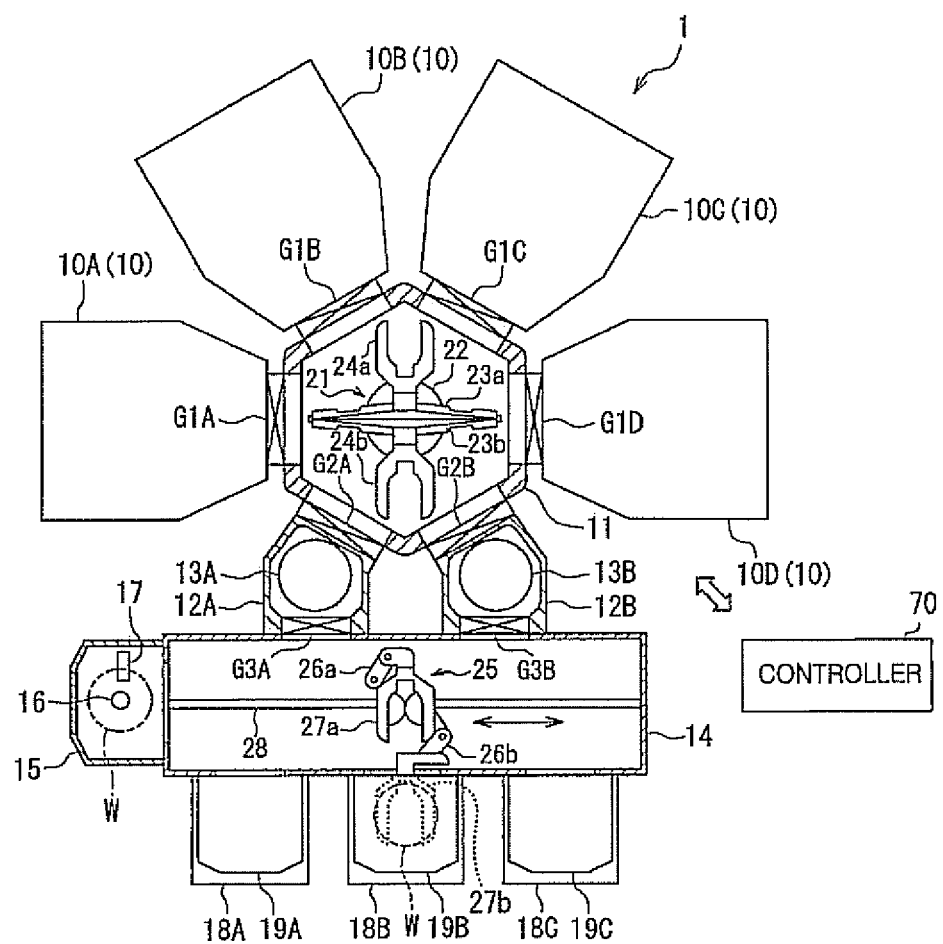
FIG. 1 is a top view schematically showing a substrate processing system in accordance with a first embodiment of the present invention.

First, a configuration of a substrate processing system in accordance with a first embodiment of the present invention will be described with reference to FIG. 1. FIG. 1 is a top view showing a schematic configuration of a substrate processing system of the present embodiment. A substrate processing system 1 of the present embodiment performs a film forming process on, e.g., a substrate W for manufacturing semiconductor devices, through a series of operations.

The substrate processing system 1 includes a plurality of process modules (hereinafter, also referred to as "PM") for performing predetermined processing on the substrate W. In the present embodiment, the substrate processing system 1 includes four PMs 10A to 10D. Each of the PMs 10A to 10D has a processing chamber whose inner space can be maintained in a predetermined depressurized atmosphere (vacuums state) and devices for performing a process in the processing chamber. The configurations of the PMs 10A to 10D will be described in detail later.

The substrate processing system 1 further includes a first transfer chamber 11 and two load-lock chambers 12A and 12B. In the present embodiment, the first transfer chamber 11 has six side surfaces. The PMs 10A to 10D and the load-lock chambers 12A and 12B are respectively disposed near the side surfaces of the first transfer chamber 11. In the example shown in FIG. 1, the PMs 10A, 10B, 10C and 10D and the load-lock chambers 12B and 12A are arranged in a clockwise direction to surround the first transfer chamber 11 in that order. The inner space of the first transfer chamber 11 can be maintained in a predetermined depressurized atmosphere in the case of the processing chambers of the PMs 10A to 10D.

The inner spaces of the load-lock chambers 12A and 12B can be switched between an atmospheric pressure state and a vacuum state. A substrate mounting table 13A for mounting a substrate W thereon is provided in the load-lock chamber 12A. A substrate mounting table 13B for mounting a substrate W thereon is provided in the load-lock chamber 12B.

The substrate processing system 1 further includes gate valves G1A, G1B, G1C, G1D, G2A, and G2B. The gate valve G1A is disposed between the first transfer chamber 11 and the processing chamber of the PM 10A. The gate valve G1B is disposed between the first transfer chamber 11 and the processing chamber of the PM 10B. The gate valve G1C is disposed between the first transfer chamber 11 and the processing chamber of the PM 10C. The gate valve G1D is disposed between the first transfer chamber 11 and the processing chamber of the PM 10D. The gate valve G2A is disposed between the first transfer chamber 11 and the load-lock chamber 12A. The gate valve G2B is disposed between the first transfer chamber 11 and the load-lock chamber 12B.

Each of the gate valves G1A to G1D, G2A, and G2B has a function of opening/closing an opening formed in a partition wall between two adjacent spaces. The gate valves G1A to G1D in a closed state airtightly seal the processing chambers of the PMs 10A to 10D. The gate valve G1A to G1D in an open state allow the substrate W to be transferred between the respective processing chambers and the first transfer chamber 11. The gate valves G2A and G2B in a closed state maintain airtightness of the first transfer chamber 11. The gate valves G2A and G2B in an open state allow the substrate W to be transferred between the first transfer chamber 11 and the load-lock chambers 12A and 12B.

The substrate processing system 1 further includes a second transfer chamber 14. The second transfer chamber 14 has a rectangular shape of which horizontal cross section is long in one direction (left-right direction in FIG. 1). The load-lock chambers 12A and 12B are disposed between the first transfer chamber 11 and the second transfer chamber 14. One side of the second transfer chamber 14 is adjacent to the load-lock chambers 12A and 12B. Although it is not illustrated, the second transfer chamber 14 includes circulation equipments for supplying, e.g., nitrogen gas or clean air, into the inner space thereof by downward flow.

The substrate processing system 1 further includes gate valves G3A and G3B. The gate valve G3A is disposed between the load-lock chamber 12A and the second transfer chamber 14. The gate valve G3B is disposed between the load-lock chamber 12B and the second transfer chamber 14. Each of the gate valves G3A and G3B has a function of opening/closing an opening formed in a partition wall between two adjacent spaces. The gate valves G3A and G3B in a closed state maintain airtightness of the load-lock chambers 12A and 12B. The gate valves G3A and G3B in an open state allow the substrate W to be transferred between the load-lock chambers 12A and 12B and the second transfer chamber 14.

The substrate processing system 1 further includes an orienter 15 for position-aligning the substrate W. The orienter 15 is connected to one end portion of the second transfer chamber 14 in a lengthwise direction. The orienter 15 includes: a rotary plate 16 rotated by a driving motor (not shown); and an optical sensor 17, provided at a position around the rotary plate 16, for detecting a periphery of the substrate W.

The substrate processing system 1 further includes a plurality of load ports. In the example shown in FIG. 1, the substrate processing system 1 includes three load ports 18A to 18C. The load ports 18A to 18C are disposed adjacent to a side of the second transfer chamber 14 which is opposite to the side adjacent to the load-lock chambers 12A and 12B. Cassette containers 19A to 19C can be placed on the load ports 18A to 18C, respectively. Each of the cassette containers 19A to 19C accommodates therein substrates W arranged in multiple stages at a predetermined interval.

The substrate processing system 1 further includes a first transfer unit 21 disposed in the first transfer chamber 11 and a second transfer unit 25 disposed in the second transfer chamber 14. The first transfer unit 21 transfers substrates between the processing chambers of the PMs 10A to 10D and the load-lock chambers 12A and 12B. The second transfer unit 25 transfers substrates between the cassette containers 19A to 19C on the load ports 18A to 18C, the load-lock chambers 12A and 12B, and the orienter 15.

The first transfer unit 21 has a base 22, a pair of transfer arms 23*a* and 23*b* connected to the base 22 to be opposite from each other, a fork 24*a* provided at a leading end of the transfer arm 23*a*, and a fork 24*b* provided at a leading end of the transfer arm 23*b*. The transfer arms 23*a* and 23*b* can extend, contract and rotate about the rotation axis of the base 22. The forks 24*a* and 24*b* serve as holding members for placing and holding substrates W thereon. The first transfer unit 21 transfers the substrates W held on the forks 24*a* and 24*b*.

The second transfer unit 25 can move along a guide rail 28 disposed in the second transfer chamber 14 in the lengthwise direction of the second transfer chamber 14 (left-right direction in FIG. 1). The second transfer unit 25 includes a pair of transfer arms 26*a* and 26*b* vertically arranged in two stages, a fork 27*a* provided at a leading end of the transfer arm 26*a*, and a fork 27*b* provided at a leading end of the transfer arm 27*b*. The transfer arms 26*a* and 26*b* can extend, contract and rotate. The forks 27*a* and 27*b* serve as holding members for placing and holding substrates W thereon. The second transfer unit 25 transfers the substrates W held on the forks 27*a* and 27*b*.

The substrate processing system 1 further includes a control unit 70 that is connected to the components of the substrate processing system 1 and controls the components of the substrate processing system 1. The configuration of the control unit 70 will be described later.

Figure 2:
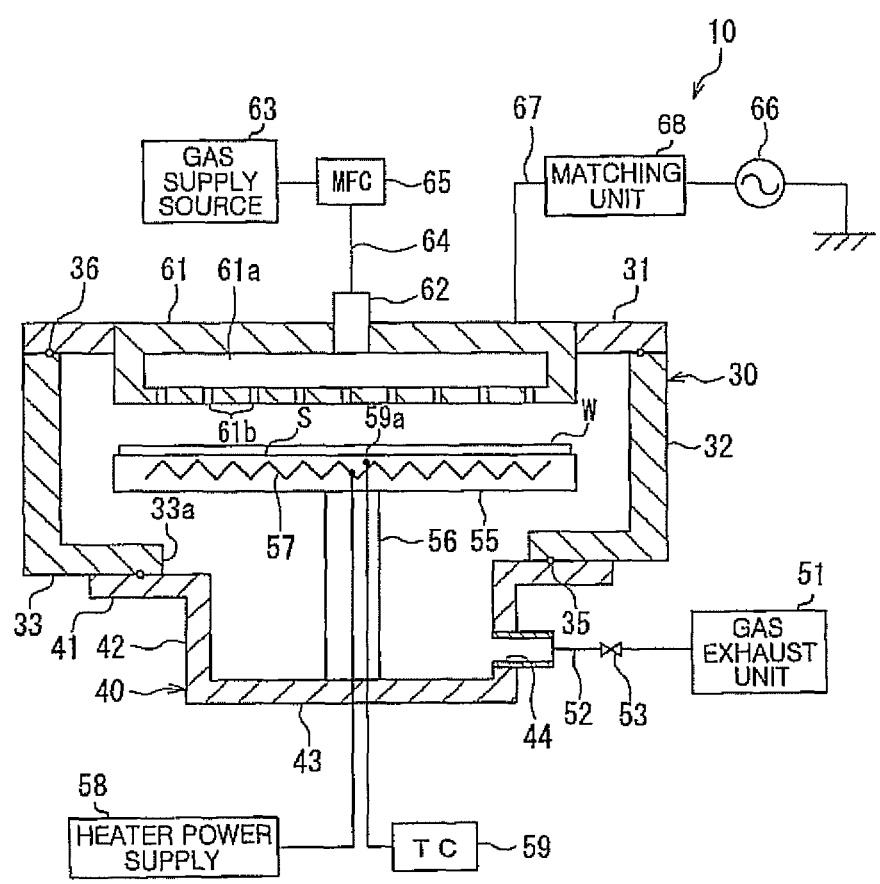
FIG. 2 is a cross sectional view showing a configuration of a process module in the first embodiment of the present invention.

Next, the configurations of the PMs 10A to 10D will be described in detail with reference to FIG. 2. FIG. 2 is a cross sectional view showing the configuration of the PM of the present embodiment. In the PMs 10A to 10D, predetermined processes such as film formation and the like are performed on the substrates W. For example, in the present embodiment, the same film formation is performed in each of the PMs 10A to 10D. Further, in the present embodiment, the PMs 10A to 10D have the same configuration. Hereinafter, if it is not required to distinguish the PMs 10A to 10D, the PMs 10A to 10D will be denoted by the PM 10.

The PM 10 has a processing chamber 30 for performing a predetermined process on a substrate, and a gas exhaust chamber 40 connected to the processing chamber 30. The processing chamber 30 of the PM 10A corresponds to a first processing chamber of the present invention. The processing chamber 30 of the PM 10B corresponds to a second processing chamber of the present invention. The processing chamber 30 of the PM 10C corresponds to a third processing chamber of the present invention. The processing chamber 30 of the PM 10D corresponds to a fourth processing chamber of the present invention.

The processing chamber 30 includes a plate-shaped ceiling portion 31, a plate-shaped bottom portion 33, and a sidewall 32 that connects the ceiling portion 31 and the bottom portion 33. The processing chamber 30 has a substantially cylindrical shape, for example. Although it is not illustrated, a loading/unloading port through which the substrate W is transferred between the PM 10 and the first transfer chamber 11 (see FIG. 1) is formed at the sidewall 32 of the PM 10. By opening the gate valves G1A to G1D (see FIG. 1) disposed between the first transfer chamber and the processing chambers 30 of the PMs 10, the substrate W can be loaded/unloaded through the loading/unloading port. An opening 33*a* is formed at the center of the bottom portion 33. The gas exhaust chamber 40 is connected to the bottom portion 33 so as to cover an opening 33*a*.

The gas exhaust chamber 40 includes a ring-shaped flange 41, a plate-shaped bottom portion 43, and a sidewall 42 that connects the flange 41 and the bottom portion 43. The flange 41 is coupled to the bottom portion 33 of the processing chamber 30. A gas exhaust hole 44 is formed at the sidewall 42.

The inner spaces of the processing chamber 30 and the gas exhaust chamber 40 can be maintained in a predetermined depressurized atmosphere (vacuum state). An O-ring as a sealing member for ensuring airtightness is disposed at a connecting portion between the processing chamber 30 and the gas exhaust chamber 40 and connecting portions of the components of the gas exhaust chamber 40 and the processing chamber 30. In the example shown in FIG. 2, an annular O-ring 35 is disposed at the connecting portion between the processing chamber 30 and the gas exhaust chamber 40, i.e., the connecting portion between the bottom portion 33 of the processing chamber 30 and the flange 41 of the gas exhaust chamber 40. Further, an annular O-ring 36 is disposed at the connecting portion between the ceiling portion 31 and the sidewall 32 of the processing chamber 30.

The PM 10 further includes a gas exhaust unit 51 provided outside the processing chamber 30 and the gas exhaust chamber 40, a gas exhaust line 52 that connects the gas exhaust hole 44 and the gas exhaust unit 51, and a valve 53 disposed in the gas exhaust line 52. The valve 53 in a closed state maintains airtightness of the processing chamber 30 and the gas exhaust chamber 40. The valve 53 in an open state allows pressures in the processing chamber 30 and the gas exhaust chamber 40 to be decreased by the gas exhaust unit 51. The pressures in the processing chamber 30 and the gas exhaust chamber 40 are decreased to a predetermined level by operating the gas exhaust unit 51.

The PM 10 further includes a susceptor 55 disposed in the processing chamber 30, and a supporting member 56 for supporting the susceptor 55 in the processing chamber 30 and the gas exhaust chamber 40. The susceptor 55 is a substrate mounting table for horizontally supporting the substrate W. The susceptor 55 has a substrate mounting surface S on which the substrate W is mounted and a bottom surface opposite thereto. One end of the supporting member 56 is fixed at the central portion of the bottom surface of the susceptor 55. The other end of the supporting member 56 is fixed at the bottom portion 43 of the gas exhaust chamber 40.

Although it is not illustrated, the susceptor 55 includes a plurality of support pins (not shown) that can protrude and retract with respect to the substrate mounting surface S. The support pins are vertically movable by an elevation mechanism (not shown). When the support pins are in a raised position, the substrate W can be transferred to and from the first transfer unit 21.

The PM 10 further includes a heater 57, a heater power supply 58, and a thermocouple 59 (denoted by TC in FIG. 2). The heater 57 and a temperature measuring portion 59a of the thermocouple 59 are buried in the susceptor 55. The heater power supply 58 is provided outside the processing chamber and the gas exhaust chamber 40. The heater 57 is connected to the heater power supply 58 through a wiring extending through the supporting member 56, for example. The heater power supply 58 supplies to the heater 57 an electrical output for heating the substrate W mounted on the susceptor 55 to a predetermined temperature. The temperature of the susceptor 55 is measured by the thermocouple 59.

The PM 10 further includes a shower head 61 provided at the ceiling portion 31 of the processing chamber 30. The shower head 61 includes a gas diffusion space 61a formed therein, and a plurality of gas injection holes 61b penetrating through the shower head 61 from the gas diffusion space 61a toward the susceptor 55.

The PM 10 further includes: a gas inlet line 62, formed at a side of the shower head 61 which is opposite to the gas injection holes 61b, communicating with the gas diffusion space 61a; a gas supply source 63 provided outside the processing chamber 30 and the gas exhaust chamber 40; a gas line 64 for connecting the gas inlet line 62 and the gas supply source 63; and an MFC (mass flow controller) 65 and a valve (not shown) disposed in the gas line 64. The gas supply source 63 supplies to the shower head 61 a film forming material gas used for film formation, a cleaning gas for cleaning the inside of the processing chamber 30 and the inside of the gas exhaust chamber 40, a purge gas for replacing atmospheres in the processing chamber 30 and the gas exhaust chamber 40, or the like. These gases are supplied into the gas diffusion space 61a through the gas line 64 and the gas inlet line 62 and then are injected into the processing chamber 30 through the gas injection holes 61b.

The PM 10 further includes a high frequency power supply 66 provided outside the processing chamber 30 and the gas exhaust chamber 40, a wiring 67 for connecting the shower head 61 and the high frequency power supply 66, and a matching unit 68 disposed in the wiring 67. The high frequency power supply 66 supplies to the shower head 61 a high frequency power for converting a film forming material gas supplied into the processing chamber 30 into a plasma.

In the PM 10 configured as described above, a thin film such as a Ti film, a TiN film or the like can be formed on the surface of the substrate W by, e.g., a chemical vapor deposition method (hereinafter, referred to as "CVD method"). Here, an example of the thin film forming method will be described. In this method, first, the inner spaces of the processing chamber 30 and the gas exhaust chamber 40 are set to a vacuum state. Next, the substrate W is mounted on the susceptor 55 and heated by the heater 57. Thereafter, a source gas is supplied toward the substrate W through the shower head 61 (the gas injection holes 61b), thereby forming a thin film on the surface of the substrate W. Further, a high frequency power may be supplied from the high frequency power supply 66 to the shower head 61 to accelerate the film forming reaction. In that case, a film can be formed by converting the source gas supplied into the processing chamber 30 through the shower head 61 into a plasma.

Figure 3:
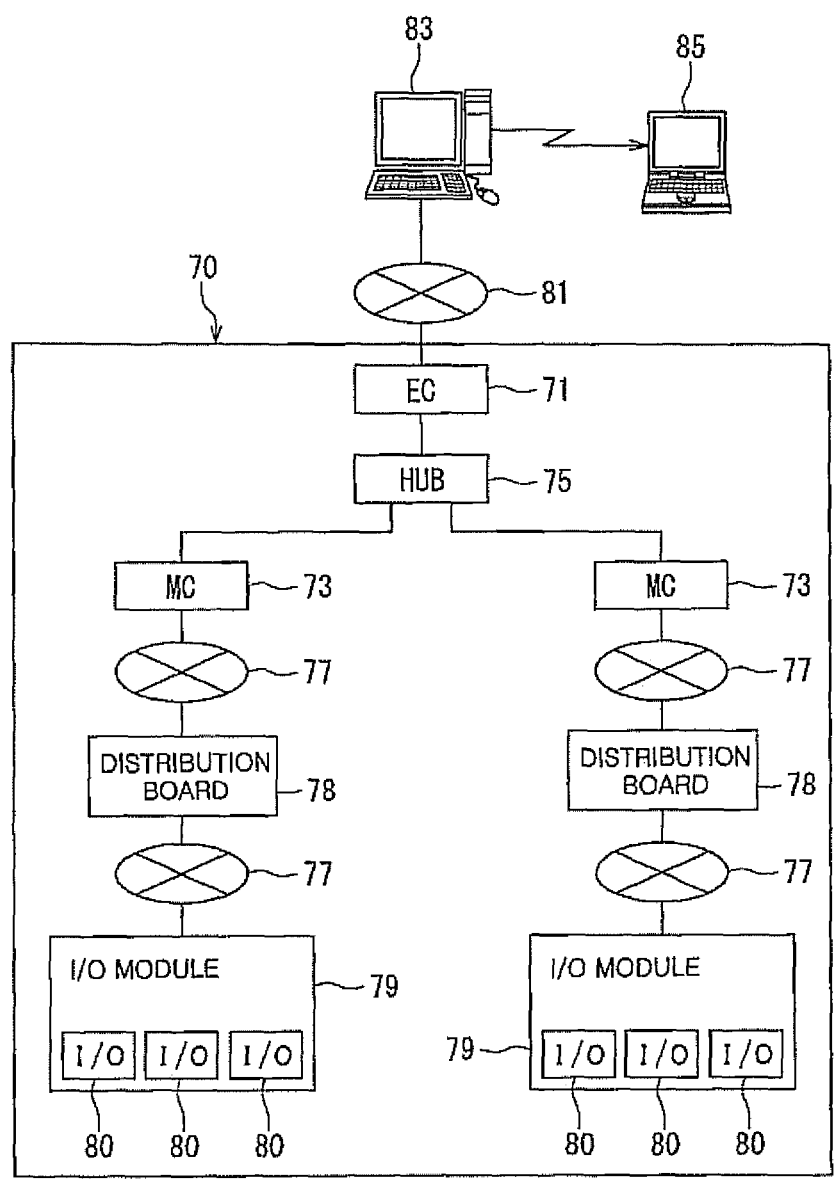
FIG. 3 is a block diagram showing a hardware configuration of a control unit of the substrate processing system in accordance with the first embodiment of the present invention.

The components of the substrate processing system 1 are connected to and controlled by the control unit 70. The control unit 70 of the substrate processing system 1 of the present embodiment will be described with reference to FIG. 3. FIG. 3 is a block diagram showing a hardware configuration of the control unit 70 of the substrate processing system 1. As shown in FIG. 3, the control unit of the substrate processing system 1 includes an equipment controller 71 (hereinafter, also referred to as "EC"), a plurality of (only two shown in FIG. 3) module controllers 73 (hereinafter, also referred to as "MC"), and a switching hub (HUB) 75 for connecting the EC 71 and the MCs 73.

The EC 71 is a main controller (master controller) for controlling an overall operation of the substrate processing system 1 by controlling the MCs 73. The MCs 73 are sub-controller (slave controller) for controlling operations of the PMs 10A to 10D, the first transfer chamber 11 including the first transfer unit 21 and the second transfer chamber 14 including the second transfer unit 25, under the control of the EC 71. The switching hub 75 performs switching of the MCs 73 connected to the EC 71 in accordance with a control signal from the EC 71.

The EC 71 controls the overall operation of the substrate processing system 1 by transmitting control signals to the respective MCs 73 based on the recipes including the processing condition data and the control programs for realizing various processes to be performed on the substrate W by the substrate processing system 1.

The control unit 70 further includes sub-networks 77, distribution boards 78 and input/output (hereinafter, referred to as "I/O") modules 79. Each of the MCs 73 is connected to the I/O module 79 via the sub-network 77 and the distribution board 78.

Each of the I/O modules 79 has a plurality of I/O units 80. The I/O units 80 are connected to respective end devices of the substrate processing system 1. Although it is not illustrated, the I/O units 80 include I/O boards for controlling input/output of digital signals, analog signals and serial signals. The control signals for the respective end devices are output from the I/O units 80. Further, the output signals from the respective end devices are input to the respective I/O units 80. The end devices connected to the I/O units 80 include, e.g., MFCs (mass flow controllers) for various gases such as a film forming material gas and the like in the PMs 10A to 10D, a pressure gauge, an APC (automatic pressure control) valve, the first transfer unit 21, the second transfer unit 25, and the gate valves G1A to G1D.

The EC 71 is connected via a LAN (Local Area Network) to a computer 83 as an MES (Manufacturing Execution System) for managing an overall manufacturing process of a factory where the substrate processing system 1 is installed. The computer 83 feedbacks in real time information on processes performed in the factory to a main operation system in cooperation with the control unit 70 of the substrate processing system 1 and also determines the processes in consideration of a load of the entire factory or the like. The computer 83 may be connected to an information processing unit, e.g., a computer 85 or the like.

Figure 4:
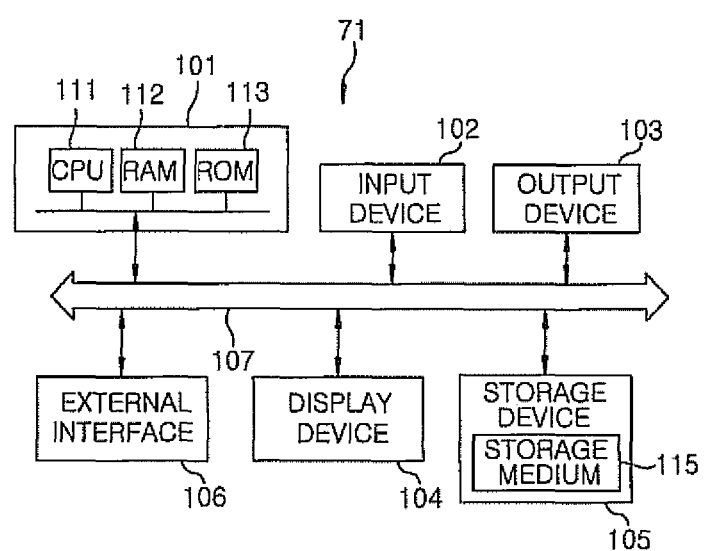
FIG. 4 is a block diagram showing a hardware configuration of an equipment controller of FIG. 3.

Hereinafter, an example of the hardware configuration of the EC 71 will be described with reference to FIG. 4. The EC 71 includes a main control unit 101, an input device 102 such as a keyboard, a mouse or the like, an output device 103 such as a printer or the like, a display device 104, a storage device 105, an external interface 106, and a bus 107 for connecting these devices. The main control unit 101 has a CPU (central processing unit) 111, a RAM (random access memory) 112 and a ROM (read only memory) 113. The storage device 105 is not particularly limited as long as information can be stored. For example, the storage device 105 is a hard disk device or an optical disk device. Further, the storage unit 105 stores information in a computer-readable storage medium 115 and reads out information from the storage medium 115. The storage medium 115 is not particularly limited as long as information can be stored. For example, the storage medium 115 is a hard disk, an optical disk, a flash memory or the like. The storage medium 115 may store therein recipes of a substrate transfer control method of the present embodiment.

In the EC 71, the CPU 111 can implement the substrate transfer control method of the present embodiment by executing the program stored in the ROM 113 or the storage unit 105 while using the RAM 112 as an operation region. The computers 83 and 85 shown in FIG. 3 have the hardware configuration shown in FIG. 4, for example. The hardware configuration of the MC 73 shown in FIG. 3 is the same as that shown in FIG. 4 or a part of that shown in FIG. 4, in which unnecessary components are omitted.

Figure 5A:
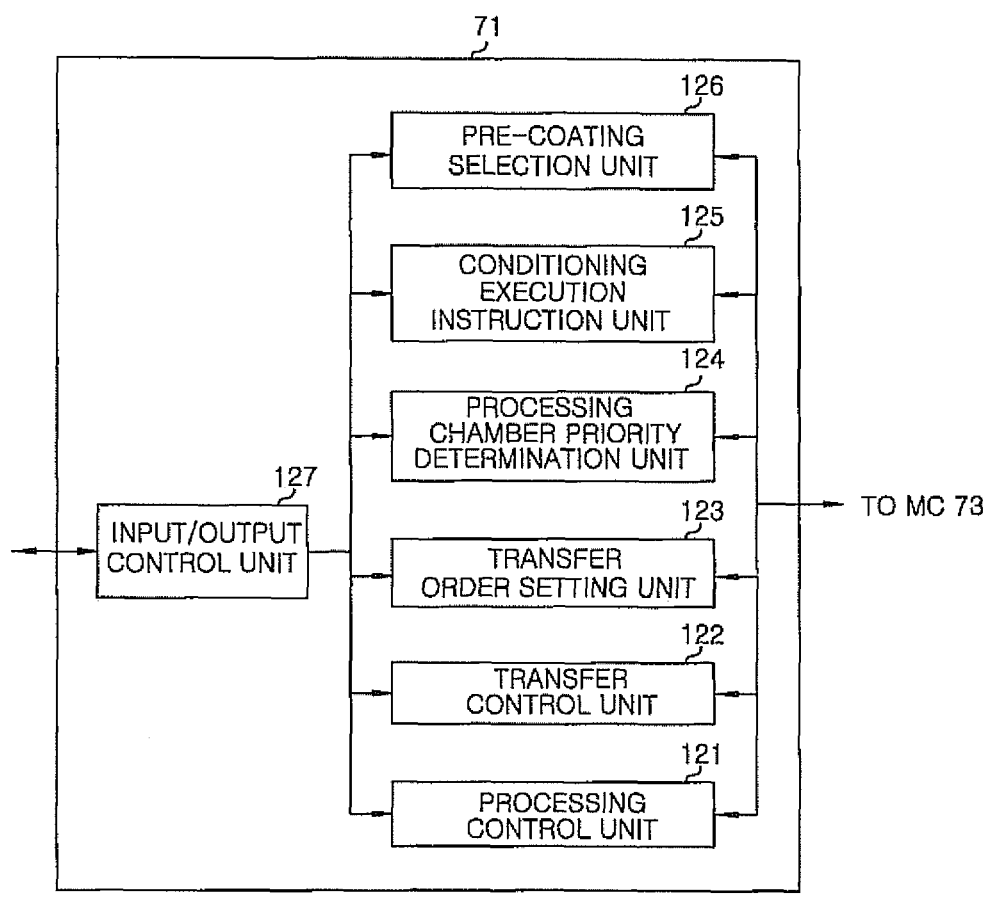
FIG. 5A is a functional block diagram showing functional elements of the equipment controller of FIG. 3.

Next, the functional elements of the EC 71 and the MC 73 will be described with reference to FIGS. 5A and 5B. FIG. 5A is a functional block diagram showing a functional structure of the EC 71. In the following description, it is assumed that the hardware configuration of the EC 71 is the same as that shown in FIG. 4, so that reference numerals in FIG. 4 will be used for corresponding parts. As shown in FIG. 5A, the EC 71 includes a processing control unit 121, a transfer control unit 122, a transfer order setting unit 123, a processing chamber priority determination unit 124, a conditioning execution instruction unit 125, a pre-coating selection unit 126, and an input/output control unit 127. These are realized by the CPU 111 that executes the program stored in the ROM 113 or the storage unit 105 while using the RAM 112 as an operation region.

The processing control unit 121 controls the PMs 10A to 10D to perform a desired film forming process by transmitting control signals to the MCs 73 based on the recipes, parameters or the like stored in advance in the storage unit 105.

The transfer control unit 122 controls the substrate W to be transferred between the load-lock chambers 12A and 12B and the PMs 10A to 10D or among the cassette containers 19A to 19C of the load ports 18A to 18C, the load-lock chambers 12A and 12B, and the orienter 15 by transmitting the control signals to the MC 73 of the first transfer chamber 11 including the first transfer unit 21 and the MC 73 of the second transfer chamber 14 including the second transfer unit 25 based on the recipes, parameters or the like stored in advance in the storage unit 105.

The transfer order setting unit 123 sets the order of loading the substrate W into the respective PMs 10A to 10D based on the recipes or the parameters stored in advance in the storage unit 105 and the information transmitted from the MC 73, such as the accumulated number of processed substrates in the respective PMs 10A to 10D or the like.

The processing chamber priority determination unit 124 determines an order of the priority in processing substrates W or executing conditioning based on predetermined rules for the PMs 10A to 10D. The predetermined rules will be described later.

The conditioning execution instruction unit 125 generates a cleaning execution instruction signal for executing cleaning, a pre-coating execution signal for pre-coating and a short-time pre-coating execution signal for executing short-time precoating, in the PMs 10A to 10D. Further, the conditioning execution instruction unit 125 instructs to executing predetermined cleaning and/or pre-coating, short-time pre-coating in the PMs 10A to 10D through the MCs 73.

The pre-coating selection unit 126 selects types of pre-coating performed in the PMs 10A to 10D. Here, the pre-coating is classified into at least two types different in time for one pre-coating. For example, one is conventional pre-coating that is performed for a relatively long period of time immediately after completion of cleaning, and another is short-time pre-coating that is performed at a predetermined interval between completion of previous conditioning and start of next conditioning.

The short-time pre-coating is classified into at least two types, e.g., long-cycle pre-coating and short-cycle pre-coating, which are different in an interval of pre-coating. In the long-cycle pre-coating, the pre-coating is performed whenever "a" number of substrates W are processed in the respective PMs 10. In the short-cycle pre-coating, the pre-coating is performed whenever "b" number of substrates W are processed in the respective PMs 10. Here, "b" is smaller than "a".

The input/output control unit 127 controls an input from the input device 102, an output of the output device 103, display on the display device 104, and an input/output of data through the external interface 106.

Figures 5B, 6:
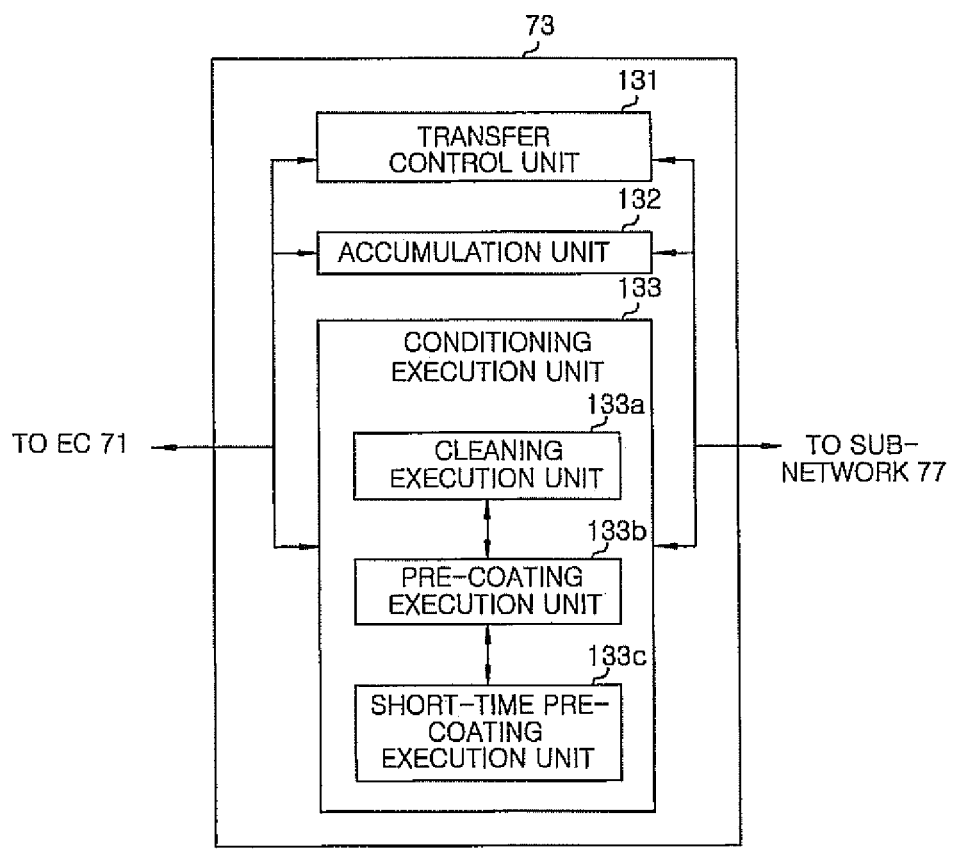
FIG. 5B is a functional block diagram showing functional elements of a module controller of FIG. 3.
FIG. 6 shows timing of executing conditioning of the process module in the substrate processing system of the first embodiment and the accumulated number of substrates processed after completion of previous conditioning.

FIG. 5B is a functional block diagram showing functional elements of the MC 73. In the following description, it is assumed that the hardware configuration of the MC 73 is the same as that shown in FIG. 4, so that reference numerals in FIG. 4 will be used for corresponding parts. As shown in FIG. 5B, the MC 73 includes a transfer control unit 131, an accumulation unit 132, and a conditioning execution unit 133. These are realized by the CPU 111 that executes the program stored in the ROM 113 or the storage unit 105 while using the RAM 112 as an operation region.

The transfer control unit 131 controls the substrates W to be transferred between the load-lock chambers 12A and 12B and the PMs 10A to 10D and between the cassette containers 19A to 19C on the load ports 18A to 18C, the load-lock chambers 12A and 12B and the orienter 15 by transmitting control signals to the MC 73 of the first transfer chamber 11 including the first transfer unit 21 and the MC 73 of the second transfer chamber 14 including the second transfer unit 25 based on the recipes or the parameters stored in advance in the storage unit 105 of the EC 71.

The accumulation unit 132 counts the number of processed substrates W after completion of previous pre-coating or previous cleaning in the respective PMs 10A to 10D and accumulates the counted number.

The conditioning execution unit 133 includes a cleaning execution unit 133a, a pre-coating execution unit 133b, and a short-time pre-coating execution unit 133c. The cleaning execution unit 133a executes cleaning in the respective PMs 10A to 10D in accordance with an instruction from the conditioning execution instruction unit 125 of the EC 71. The pre-coating execution unit 133b executes pre-coating in the respective PMs 10A to 10D in accordance with an instruction from the conditioning execution instruction unit 125 of the EC 71. The short-time pre-coating execution unit 133c executes the long-cycle pre-coating or the short-cycle pre-coating in the respective PMs 10A to 10D in accordance with instructions from the conditioning execution instruction unit 125 and the pre-coating selection unit 126 of the EC 71.

In the substrate processing system 1 configured as described above, a predetermined process determined by the recipe is performed on the substrate W under the control of the control unit 70. Here, the case of performing the process by using the PM 10A will be described as an example. However, the case of using the other PMs 10B to 10D is the same.

First, one substrate W is taken out from the cassette container 19A by the second transfer unit 25 (see FIG. 1) and then loaded into the orienter 15 under the control of the transfer control unit 131 of the MC 73. Next, the substrate W is position-aligned in the orienter 15. Thereafter, the substrate W is unloaded from the orienter 15 by the second transfer unit 25 and then loaded into any one of the load-lock chambers 12A and 12B. Then, the substrate W is mounted on the substrate mounting table 13A or 13B, and the corresponding load-lock chamber 12A or 12B is depressurized from the atmospheric state to the vacuums state.

Next, the substrate W mounted on the substrate mounting table 13A or 13B is unloaded from the load-lock chamber 12A or 12B by the first transfer unit 21 (see FIG. 1) under the control of the transfer control unit 122 and the transfer order setting unit 123 of the EC 71 and the transfer control unit 131 of the MC 73. Thereafter, the substrate W is loaded into the processing chamber 30 of the PM 10A and then mounted on the susceptor 55 of the PM 10A. Next, a film forming process is performed on the substrate W in the PM 10A based on a predetermined recipe under the control of the processing control unit 121.

Next, the substrate W is unloaded from the processing chamber 30 of the PM 10A by the first transfer unit 21 and then transferred into any one of the load-lock chambers 12A and 12B under the control of the transfer control unit 122 and the transfer order setting unit 123 of the EC 71 and the transfer control unit 131 of the MC 73. Thereafter, the substrate W is mounted on any one of the substrate mounting tables 13A and 13B, and the corresponding load-lock chamber 12A or 12B is switched from the vacuum state to the atmospheric state. Next, the substrate W mounted on the substrate mounting table 13A or 13B is transferred from the load-lock chamber 12A or 12B into the cassette container 19A by the second transfer unit 25 under the control of the transfer control unit 131 of the MC 73.

While the above series of process is being performed in the PM 10A, the same processes can be performed on other substrates W in the PMs 10B to 10D.

Hereinafter, a substrate processing method performed in the substrate processing system of the present embodiment will be described with reference to FIGS. 6, 7A and 7B. FIG. 6 shows an execution timing of conditioning C in the PMs 10A to 10D and the accumulated number of processed substrates W after completion of previous conditioning in the substrate processing method of the present embodiment. Numerical values in lines in FIG. 6 are specific examples of the accumulated number M of the processed substrates W. The accumulated number M is counted by the accumulation unit 132 of the MC 73 on the basis of the execution timing of the conditioning C. As shown in FIG. 6, the execution timings of the conditioning C in the respective PMs 10A to 10D are not overlapped and are sequentially shifted at the interval of 167 sheets. Here, a period in which the conditioning C is performed once in all PMs is set to one cycle. In other words, FIG. 6 shows a process of one cycle.

Referring to FIG. 6, while the conditioning C is being executed in one of the PMs 10A to 10D, the conditioning C is not executed in the other three PMs 10. In other words, during one cycle shown in FIG. 6, the control unit 70 performs control such that the state in which the substrates W are simultaneously processed in all PMs 10 (the simultaneous use state of all processing chambers) does not occur. The state shown in FIG. 6 can be realized by the substrate processing system 1 that performs the following sequences.

The following (1) to (3) are basic principles.

(1) A first rule, a second rule and a third rule, which will be described later, are applied when the accumulated number of processed substrates W in all PMs is a multiple of X (X indicating the number of substrates W in one lot.

(2) The conditioning is executed when the accumulated number of processed substrates W in all PMs is a multiple of X.

(3) After the conditioning is completed, the PM where the conditioning is just completed is used. In the present embodiment, it is assumed that one lot contains 25 substrates W (X=25).

Further, it is assumed that the number of PMs 10 that are usable in the substrate processing system 1 is n (n being a positive integer) and a set value of the number of substrates W processed between completion of previous conditioning in the respective PMs 10 and start of next conditioning is N (N being a positive integer). At this time, the control unit 70 performs control such that, while the conditioning is being executed in one of the PMs 10A to 10D, the number P of substrates W processed in each of the other PMs 10 satisfies P=N/(n−1) (here, rounded up or down after decimal point). Specifically, the control unit 70 controls the conditioning time in one PM 10, the transfer time for one substrate W to the other PMs 10 by the first and the second transfer unit 21 and 25, and the like.

Next, the processing chamber priority determination unit 124 determines priority for executing conditioning or processing the substrates W in the PMs 10A to 10D based on predetermined rules. Here, the predetermined rules may be, e.g., the following first to third rules. The transfer order setting unit 123 sets the order of loading substrates W into the PMs 10A to 10D based on the priority. Further, the conditioning execution instruction unit 125 generates a cleaning execution instruction signal and a pre-coating execution instruction signal and executes predetermined conditioning in the PMs 10A to 10D.

First rule: When the accumulated number M of substrates processed in any one of the PMs 10A to 10D, which is counted by the accumulation unit 132 and determined to be the third in a descending order among those in the PMs 10A to 10D, is smaller than (N×3/6) (here, rounded up after decimal point), the processing is performed by using the PMs 10A to 10D having the first, the second and the third accumulated numbers M of processed substrates W in the descending order.

Second rule: When the accumulated number M of substrates processed in any one of the PMs 10A to 10D, which is counted by the accumulation unit 132 and determined to be the second in a descending order among those in the PMs 10A to 10D, is smaller than (N×5/6) (here, rounded up after decimal point), the processing is performed by using the PMs 10A to 10D having the first, the second and the fourth accumulated numbers M of processed substrates W in the descending order.

Third rule: When the first and the second rule are not applied, the processing is performed by using the PMs 10A to 10D having the first, the third and the fourth accumulated numbers M of processed substrates W in the descending order which are counted by the accumulation unit 132.

The first rule, the second rule and the third rule are applied in that order. When the accumulated number M of processed substrates is the same in each of the PMs 10A to 10D (the first to the fourth processing chamber), the rules are applied in the order of the PMs 10A to 10D. Further, the PM 10 having the first accumulated number M of processed substrates in the descending order which is counted by the accumulation unit 132 is continuously used until the number of processed substrates W reaches the set value N.

In the present embodiment, by applying the first to the third rule, the combination of three PMs 10 selected among the PMs 10A to 10D can be used at the following ratios, and the four PMs 10 have different frequencies of use. Moreover, in the present embodiment, the PM 10A is set to the first processing chamber and thus is most frequently used.

Combination under the first rule: combination of the PMs 10A, 10B and 10C . . . use ratio 3

Combination under the second rule: combination of the PMs 10A, 10B and 10D . . . use ratio 2

Combination under the third rule: combination of the PMs 10A, 10C and 10D . . . use ratio 1

By repeatedly performing a sequence for determining a next PM 10 for processing the substrate W based on the above rules, the state in which the conditioning is executed in any one of the PMs 10 and the substrates W are processed in the other PMs 10 (hereinafter, may be referred to as "sequential conditioning state") can be realized while preventing overlapped conditioning in the PMs 10A to 10D.

FIGS. 7A and 7B show the sequence of realizing the sequential conditioning state by repeating the processing of substrates W and the conditioning in the PMs 10 based on the first to the third rule. In FIGS. 7A and 7B, as in FIG. 6, there are shown the execution timing of the conditioning C in the PMs 10A to 10D and the accumulated number M of processed substrates W after completion of previous conditioning. The accumulated number M of processed substrates is counted by the accumulation unit 132 of the MC 73 on the basis of the execution timing of the conditioning C.

In the examples shown in FIGS. 7A and 7B, in each of the PMs 10, the set value N of the number of substrates W processed between completion of previous conditioning and start of next conditioning is set to 500. The processing is performed in the unit of one lot containing 25 substrates, and the conditioning is executed when the accumulated number M of processed substrates W in each of the PMs 10 after the completion of the processing in each lot exceeds 500. While the conditioning is being executed in one of the PMs 10, the number P of substrates W processed in each of the other PMs 10 is set to 167; and the first, the second and the third rule are applied. The first to the third rule are as follows.

First rule: When the accumulated number M of substrates processed in any one of the PMs 10A to 10D, which is counted by the accumulation unit 132 and determined to be the third in a descending order among those in the PMs 10A to 10D, is smaller than 250, the processing is performed by using the PMs 10 having the first, the second and the third accumulated numbers M of processed substrates W in the descending order.

Second rule: When the accumulated number M of substrates processed in any one of the PMs 10A to 10D, which is counted by the accumulation unit 132 and determined to be the second in a descending order among those in the PMs 10A to 10D, is smaller than 417, the processing is performed by using the PMs 10 having the first, the second and the fourth accumulated number M of processed substrates W in the descending order.

Third rule: When the first and the second rule are not applied, the processing is performed by using the PMs 10 having the first, the third and the fourth accumulated numbers M of processed substrates W in the descending order which are counted by the accumulation unit 132.

The following is description on sections in FIGS. 7A and 7B.

Section 1 is an initial stage. In section 1, the substrates W are not processed in any of the PMs 10.

In section 2, the substrates W are processed in the PMs 10A to 10C by the first rule.

In section 3, the substrates W are processed in the PMs 10A, 10B and 10D by the second rule.

In section 4, the substrates W are processed in the PMs 10A, 10C and 10D by the third rule.

In section 5, the conditioning is executed in the PM 10A. In the meantime, the accumulated number M of processed substrates W in the PM 10B reaches 500 (i.e., M≥N)

In section 6, 92 substrates W are processed in each of the PM 10C and 10D until the conditioning in the PM 10A is completed.

In section 7, the accumulated number M of processed substrates W in the PM 10C exceeds 500 (MN).

In section 8, 61 substrates W are processed in each of the PM 10A and 10D until the conditioning in the PM 10B is completed.

In section 9, the accumulated number M of processed substrates W in the PM 10D exceeds 500 (MN).

In section 10, 96 substrates W are processed in each of the PM 10A and 10B until the conditioning in the PM 10C is completed.

In section 11, 71 substrates W are processed in each of the PMs 10A to 10C until the conditioning in the PM 10D is completed.

In section 12, the substrates W are processed in the PMs 10A to 10C by the first rule.

In section 13, the substrates W are processed in the PMs 10A, 10B and 10D by the second rule.

In section 14, the substrates W are processed in the PMs 10A, 10C and 10D by the third rule.

In section 15, the conditioning is executed in the PM 10A. In the meantime, the accumulated number M of processed substrates W in the PM 10B exceeds 500 (MN).

In section 16, 84 substrates W are processed in each of the PMs 10C and 10D until the conditioning in the PM 10A is completed.

In section 17, the accumulated number M of processed substrates W in the PM 10C exceeds 500 (MN).

In section 18, 6 substrates W are processed in each of the PMs 10A and 10D until the conditioning in the PM 10B is completed.

In section 19, the accumulated number M of processed substrates W in the PM 10D exceeds 500 (MN).

In section 20, 48 substrates W are processed in each of the PMs 10A and 10B until the conditioning in the PM 10C is completed.

In section 21, 119 substrates W are processed in each of the PMs 10A to 10C until the conditioning in the PM 10D is completed.

In section 22, the substrates W are processed in the PMs 10A to 10C by the first rule.

In section 23, the substrates W are processed in the PMs 10A, 10B and 10D by the second rule.

In section 24, the conditioning is executed in the PM 10A. In the meantime, the accumulated number M of processed substrates W in the PM 10B exceeds 500 (MN).

In section 25, 83 and 84 substrates W are respectively processed in the PMs 10C and 10D until the conditioning in the PM 10A is completed.

In section 26, 83 and 84 substrates W are respectively processed in the PMs 10D and 10C until the conditioning in the PM 10B is completed.

In section 27, the substrates W are processed in the PMs 10A, 10C and 10D by the first rule.

In section 28, the conditioning is executed in the PM 10C.

In section 29, the substrates W are processed in the PMs 10A, 10B and 10D by the first rule.

In section 30, the conditioning is executed in the PM 10D.

In section 31, the substrates W are processed in the PMs 10A to 10C by the first rule.

In section 32, the conditioning is executed in the PM 10A. In the meantime, the accumulated number M of processed substrates W in the PM 10B exceeds 500 (MN).

In section 33, 83 and 84 substrates W are respectively processed in the PMs 10D and 10C until the conditioning in the PM 10A is completed.

In section 34, 83 and 84 substrates W are respectively processed in the PMs 10C and 10D until the conditioning in the PM 10B is completed.

In section 35, the substrates W are processed in the PMs 10A, 10C and 10C by the first rule.

In section 36, the conditioning is executed in the PM 10C.

In section 37, the substrates W are processed in the PMs 10A, 10B and 10D by the first rule.

In section 38, the conditioning is executed in the PM 10D.

In section 39, the conditioning is executed in the PM 10A. in the meantime, the accumulated number of processed substrates W in the PM 10B reaches 500 (M≥N).

In section 40, 9 substrates W are processed in each of the PMs 10C and 10D until the conditioning in the PM 10A is completed.

In section 41, 158 substrates W are processed in each of the PMs 10A, 10C and 10D until the conditioning in the PM 10B is completed.

In section 42, the substrates W are processed in the PMs 10A, 10C and 10D by the first rule.

In section 43, the conditioning is executed in the PM 10C.

In section 44, the conditioning is executed in the PM 10D.

In section 45, the conditioning is executed in the PM 10A.

In section 46, the conditioning is executed in the PM 10B.

In section 47, the conditioning is executed in the PM 10C.

In section 48, the conditioning is executed in the PM 10D.

The sections 1 to 44 are steps for obtaining a sequential conditioning state by repeating the processing of substrates W and the conditioning in the PMs 10 based on the first to the third rule.

The sections 45 to 48 show the sequential conditioning state automatically obtained by the control unit 70 (see FIG. 6). In the sequential conditioning state, the cleaning is necessarily executed in one of the PMs 10, so that the transfer of the substrate to the other PMs 10 by the first and the second first transfer unit 21 and 25 is flexible. Accordingly, the substrates W can be efficiently processed with a high throughput without an idle time in the PMs 10.

(Simulation Test 1)

Hereinafter, a simulation test that has examined the effect of the present invention will be described. A substrate processing system having the same configuration as that of the substrate processing system 1 was used, and the processing efficiency in the case of repeating processing of substrates W, conditioning and conventional short-time pre-coating in the processing chamber 30 under the following conditions was simulated.

(Set Conditions)

Process recipe time: 60 sec

Short-time pre-coating cycle: whenever 25 sheets of substrates W are processed

Short-time pre-coating time: 87 sec conditioning cycle: 400 sheets conditioning time: 5.25 hour According to the result of the simulation, 86 substrates W were processed per hour in the substrate processing system of the comparative example, in which the conditioning is executed once in each of four PMs 10 during one cycle and the state that the substrates W are simultaneously processed in all PMs 10 (the simultaneous use state of all processing chambers) is allowed. On the other hand, 94 substrates W were processed per hour in the substrate processing system of the present invention which allows the sequential conditioning state in which the conditioning is executed in any one of the PMs 10 and the substrates W are processed in the other PMs 10 while preventing overlapped conditioning in four PMs 10. The result of the simulation has proven that the efficiency of processing substrates W is improved by the substrate processing system of the present invention. The reason for this is considered that, due to the sequential conditioning state, the transfer of substrates W to the PMs 10 by the first and the second transfer unit 21 and 25 becomes flexible and the idle time of the PMs 10 is reduced.

In the present embodiment, the PMs 10A to 10D are set to the first to the fourth processing chamber, respectively, and the first processing chamber is most frequency used. However, the above-described processes can also be applied to the case of setting one of the PMs 10B to 10D to the first processing chamber.

As described above, the sequential conditioning state can be automatically obtained under the control of the control unit 70 by repeating the processing of substrates W and the conditioning of the PMs 10 under the first to the third rules. The sequential conditioning state does not include the simultaneous use state of all processing chambers, i.e., the state in which the substrates W are simultaneously processed in all PMs 10. Accordingly, the throughput of processing the substrates W in the substrate processing system 1 can be considerably improved.

(Pre-coating Method)

Figure 8:
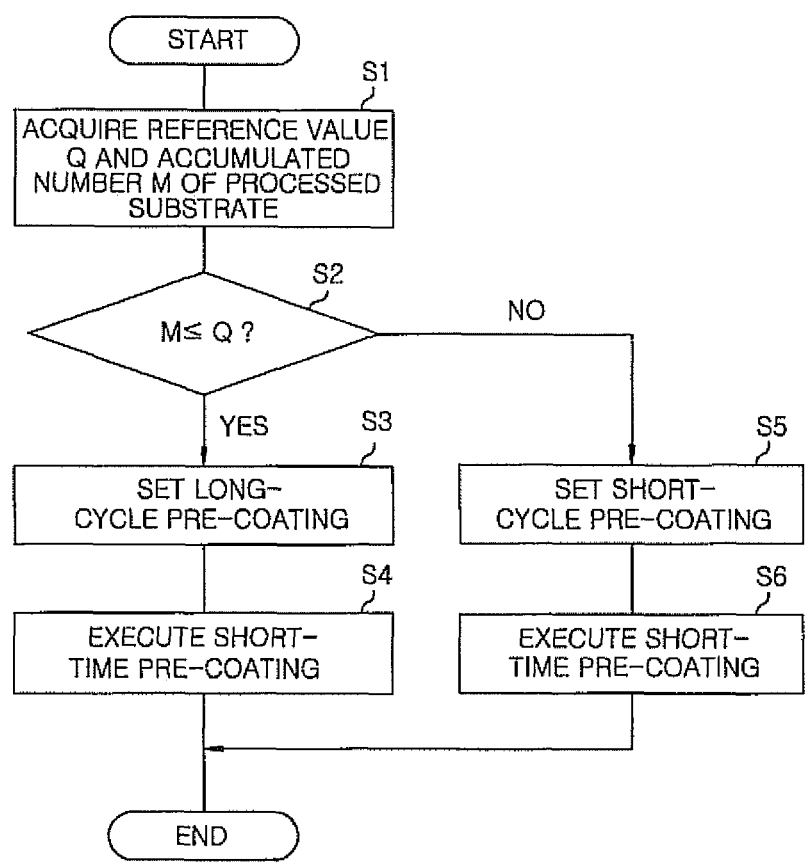
FIG. 8 is a flowchart for explaining a sequence of short-time pre-coating performed in the substrate processing system of the first embodiment.
Figure 9:
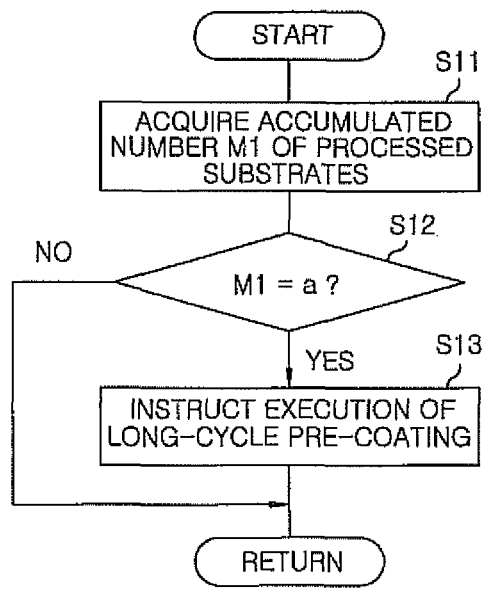
FIG. 9 is a flowchart for explaining a sequence of long-cycle pre-coating performed in the substrate processing system of the first embodiment.
Figure 10:
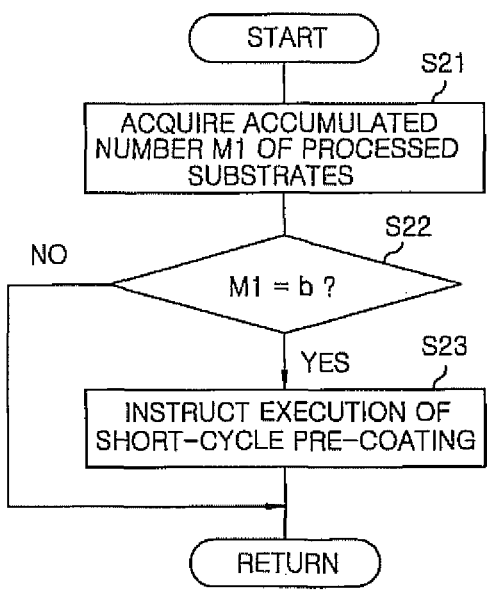
FIG. 10 is a flowchart for explaining a sequence of short-cycle pre-coating performed in the substrate processing system of the first embodiment.

Hereinafter, a short-time pre-coating method performed by the substrate processing system 1 of the present embodiment will be described with reference to FIGS. 8 to 10. FIG. 8 is a flowchart for explaining a sequence of short-time pre-coating performed in the substrate processing system 1 of the present embodiment. FIG. 9 is a flowchart for explaining a sequence of long-cycle pre-coating performed in the substrate processing system 1 of the present embodiment. FIG. 10 is a flowchart for explaining a sequence of short-cycle pre-coating performed in the substrate processing system 1 of the present embodiment.

In the substrate processing system 1 of the present embodiment, the accumulated number M of processed substrates W, which is counted by the accumulation unit 132 between completion of previous conditioning in each of the PMs 10 and start of next conditioning, is compared with a predetermined reference value Q. The reference value Q is variable and may be set in accordance with types of processing.

As shown in FIG. 8, first, in a step S1, the pre-coating selection unit 126 acquires the reference value Q and the accumulated number M of processed substrates W in a target PM 10 which is counted by the accumulation unit 132. The reference value Q is preset in accordance with types of processing performed in the respective PMs 10. The reference value Q may be set to, e.g., a value within a range from (1/4×N) to (3/4×N), N being a set value of the number of processed substrates W between completion of previous conditioning and start of next conditioning in each of the PMs 10. The pre-coating selection unit 126 refers to, as the reference value Q, a value stored as a part of parameters in the storage device 105 of the EC 71.

Next, in a step S2, the pre-coating selection unit 126 compares the accumulated number M of processed substrates W with the reference value Q and determines whether or not the accumulated number M of processed substrates W is equal to or smaller than the reference value Q. If the accumulated number M of processed substrates W is equal to or smaller than the reference value Q (YES) in the step S2, the pre-coating selection unit 126 sets long-cycle pre-coating for the corresponding PM 10 in a step S3. The long-cycle pre-coating is executed whenever the "a" number of substrates W are processed in the corresponding PM 10. Here, "a" is within a range from N/50 to N/10, for example. Next, in a step S4, the conditioning execution instruction unit 125 instructs execution of the long-cycle pre-coating set for the corresponding PM 10.

On the other hand, if the accumulated number M of processed substrates W is greater than the predetermined reference value Q (NO) in the step S2, the pre-coating selection unit 126 sets short-cycle pre-coating for the corresponding PM 10 in a step S5. The short-cycle pre-coating is executed whenever the "b" number of substrates W are processed, "b" being smaller than "a". Here, "b" is set to, e.g., 1 to N/50. In a step S6, the conditioning execution instruction unit 125 instructs execution of the short-cycle pre-coating set for the corresponding PM 10.

The sequence of the steps S1 to S6 is repeated whenever the substrates W are processed between completion of previous conditioning and start of next conditioning in the corresponding PM 10.

The long-cycle pre-coating set in the step S3 of FIG. 8 is executed in accordance with the sequence shown in FIG. 9, for example. First, in a step S11, the conditioning execution instruction unit 125 acquires the accumulated number M1 of processed substrates W in a corresponding PM 10 after completion of previous pre-coating from the accumulation unit 132. Next, in a step S12, the conditioning execution instruction unit 125 compares the accumulated number M1 of processed substrates W with "a" and determines whether or not the accumulated number M1 of processed substrates W is equal to "a". If it is determined in the step S12 that the accumulated number M1 of processed substrates W is equal to "a" (YES), the conditioning execution instruction unit 125 instructs execution of long-cycle pre-coating set for the corresponding PM 10 in a step S13. Specifically, the conditioning execution instruction unit 125 transmits an instruction signal to the short-time pre-coating execution unit 133c of the MC 73, and the short-time pre-coating execution unit 133c executes the long-cycle pre-coating.

On the other hand, if it is determined in the step S12 that the accumulated number M1 of processed substrates W is not equal to "a" (NO), the processing returns to the step S3 of FIG. 8.

The steps S11 to S13 are repeated whenever the substrates W are processed between completion of the short-time pre-coating in the corresponding PM 10 and start of next conditioning.

The short-cycle pre-coating set in the step S5 of FIG. 8 is executed in accordance with the sequence shown in FIG. 10, for example. First, in a step S21, the conditioning execution instruction unit 125 acquires the accumulated number M1 of processed substrates W after completion of previous pre-coating in a target PM 10 from the accumulation unit 132. Next, in a step S22, the conditioning execution instruction unit 125 compares the accumulated number M1 of processed substrates W with "b" and determines whether or not the accumulated number M1 of processed substrates W is equal to "b". If it is determined in the step S22 that the accumulated number M1 of processed substrates W is equal to "b" (YES), the conditioning execution instruction unit 125 instructs execution of the short-cycle pre-coating in the corresponding PM 10 in a step S23. Specifically, the conditioning execution instruction unit 125 transmits an instruction signal to the short-time pre-coating execution unit 133c of the MC 73, and the short-time pre-coating execution unit 133c executes the short-cycle pre-coating.

On the other hand, if it is determined in the step S22 that the accumulated number M1 of processed substrates W is not equal to "b" (NO), the processing returns to the step S5 of FIG. 8.

The steps S21 to S23 are repeated whenever the substrates W are processed between completion of the short-time pre-coating and start of next conditioning in the corresponding PM 10.

(Simulation Test 2)

Hereinafter, a simulation test that has examined the effect of the present invention will be described. A substrate processing system having the same configuration as that of the substrate processing system 1 was used, and the processing efficiency in the case of repeating processing of substrates W and short-time pre-coating and conditioning in the processing chamber 30 under the following conditions was simulated.

(Set Conditions)
Process recipe time: 70 sec
Short-time pre-coating cycle: 87 sec
Conditioning cycle: 400 sheet
Conditioning time: 5.25 hour Condition A (comparative example): The short-time pre-coating is executed whenever 10 substrates W are processed.

Condition B (test example): The short-time pre-coating is executed whenever 25 substrates are processed until the accumulated number M of processed substrates W after completion of previous conditioning reaches 250. After the accumulated number M of processed substrates W exceeds 250, the short-time pre-coating was executed whenever 10 substrates are processed.

The conditions A and B are controlled such that the sequential conditioning state is obtained.

According to the result of the simulation, 88 substrates W were processed per hour in the substrate processing system under the condition A (comparative example). On the other hand, 91 substrates W were processed per hour in the substrate processing system 1 under the condition B (present invention). From the result of the simulation, it is clear that the processing efficiency is improved by processing the substrates W by using the substrate processing system 1 of the present invention. This is considered because, in the substrate processing system of the present invention which employs the pre-coating method for setting a period of cycle of executing short-time pre-coating, when the accumulated number M of processed substrates W is small, the frequency of pre-coating can be decreased by increasing an interval of pre-coating.

As described above, the control unit 70 sets the variable reference value Q and sets the period of cycle of executing short-time pre-coating depending on whether or not the accumulated number M of processed substrates W is equal to or smaller than the reference value Q. Accordingly, while the pre-coating film in the processing chamber 30 is relatively stable, i.e., while the accumulated number M of processed substrates W is small, the frequency of the pre-coating can be decreased by increasing the interval of the pre-coating. Hence, it is possible to reduce time required for pre-coating and improve a throughput in the substrate processing system 1, compared to the case of executing short-time pre-coating between conditionings at a regular cycle.

In the present embodiment, the throughput in the substrate processing system 1 can be considerably improved by combining the pre-coating method and the conditioning method for obtaining the sequential conditioning state.

(Second Embodiment)

Next, a substrate processing method performed in the substrate processing system in accordance with a second embodiment of the present invention will be described with reference to FIG. 11. The substrate processing method of the present embodiment may be performed in a substrate processing system 1 having the same configuration as that shown in FIG. 1. Hereinafter, FIGS. 1 to 5A and 5B will be also referred to for description. FIG. 11 show the execution timing of conditioning C in the PMs 10A to 10D in the substrate processing method of the present embodiment and the accumulated number M of processed substrates W after completion of previous conditioning. The accumulated number M of processed substrates W is counted by the accumulation unit 132 on the basis of the execution timing of the conditioning C.

As shown in FIG. 11, the execution timing of the conditioning C is controlled such that the number of substrates that are processed in each of the PMs 10 in a state where the substrates W are simultaneously processed in all PMs 10 (the simultaneous use state of all processing chambers) does not exceed 25/n (here, rounded up after decimal point) during one cycle of executing the conditioning once in each of the PMs 10A to 10D. The state shown in FIG. 11 can be obtained by performing the following sequence in the substrate processing system 1.

The following (1) to (3) are basic principles.

(1) A fourth rule to be described below is applied when the accumulated number of processed substrates in all PMs is a multiple of X (X indicating the number of substrates W in one lot).

(2) The conditioning is executed when the accumulated number of processed substrates in all PMs is a multiple of X.

(3) After the conditioning is completed, the PM where the conditioning is just completed is used. In the present embodiment, it is assumed that one lot contains 25 substrates W (X=25).

Further, it is assumed that the number of PMs 10 that are usable in the substrate processing system 1 is n (n being a positive integer), and a set value of the number of substrates W processed between completion of previous conditioning and start of next conditioning in each of PMs 10 is N (N being a positive integer). At this time, the control unit 70 performs control such that, while the conditioning is being executed in one PM 10, the number P of substrates W processed in each of the other PMs 10 satisfies P=N/(n−1) (here, rounded up or down after decimal point). Specifically, the control unit 70 controls the conditioning time in one PM 10, the transfer time for a single substrate W to the other PMs 10 by the first and the second transfer unit 21 and 25, and the like.

Next, the processing chamber priority determination unit 124 determines priority for executing conditioning in the PMs 10A to 10D based on a predetermined rule. Here, the predetermined rule may be, e.g., a fourth rule to be described below. Based on the priority, the conditioning execution instruction unit 125 generates a cleaning execution instruction signal and a pre-coating execution instruction signal and executes predetermined conditioning in the PMs 10A to 10D.

(Fourth Rule)

In the case of processing the substrates W by using all PMs 10 that are usable in the substrate processing system 1, the conditioning is executed in a processing chamber having a largest accumulated number M of processed substrates which is counted after completion of processing of one lot containing a plurality of substrates W.

When the accumulated number M of processed substrates W is the same in each of the PMs 10A to 10D (the first to the fourth processing chamber), the fourth rule is applied to the PMs 10A to 10D in that order. The accumulated number M of processed substrates W is counted by the accumulation unit 132 of the MC 73 on the basis of the execution timing of the conditioning C.

By repeating the sequence of determining the PM 10 where the conditioning C will be executed based on the fourth rule, it is controlled such that the number of substrates W that are processed in each of the PMs 10 in the simultaneous use state of all processing chambers does not exceed 25/n (here, rounded up after decimal point).

In the example shown in FIG. 11, the set value N of the number of processed substrates W between completion of previous conditioning and start of next conditioning in each of the PMs 10 is set to 500. The processing is performed in the unit of one lot containing 25 substrates, and the conditioning is executed when the accumulated number M of processed substrates W in each of the PMs 10 which is counted after the completion of the processing for each lot exceeds 500. While the conditioning is being executed in one PM 10, the number of substrates W processed in each of the other PMs 10 is set to 167 and the number of substrates W contained in one lot is set to 25; and the fourth rule is applied.

The following is description on sections of FIG. 11.

Section 1 is an initial state. In section 1, the substrates W are not processed in any of the PMs 10.

In section 2, the substrates W are processed in four PMs 10A to 10D.

In section 3, the conditioning is executed in the PM 10A by the fourth rule.

In section 4, the substrates W are processed in four PMs 10A to 10D.

In section 5, the conditioning is executed in the PM 10B.

In section 6, the substrates W are processed in four PMs 10A to 10D.

In section 7, the conditioning is executed in the PM 10C. In the meantime, the number of substrates processed in the PM 10D exceeds 500 (M≥10)

In section 8, 17 substrates W are processed in each of the PMs 10A and 10B until the conditioning in the PM 10C is completed.

In section 9, 150 substrates W are processed in each of the PMs 10A to 10C until the conditioning in the PM 10D is completed.

In section 10, the substrates W are processed in four PMs 10A to 10D.

In section 11, the conditioning is executed in the PM 10A.

In section 12, the substrates W are processed in four PMs 10A to 10D.

In section 13, the conditioning is executed in the PM 10B.

In section 14, the substrates W are processed in four PMs 10A to 10D.

In section 15, the conditioning is executed in the PM 10C. In the meantime, the number of processed substrates in the PM 10D reaches 500 (MN).

In section 16, 17 substrates W are processed in each of the PMs 10A and 10B until the conditioning in the PM 10C is completed.

In section 17, 150 substrates W are processed in each of the PMs 10A to 10C until the conditioning in the PM 10D is completed.

In section 18, the substrates W are processed in the four PMs 10A to 10D.

In section 19, the conditioning is executed in the PM 10A.

In section 20, the substrates W are processed in the four PMs 10A to 10D.

In section 21, the conditioning is executed in the PM 10B.

In section 22, the substrates W are processed in the four PMs 10A to 10D.

In section 23, the conditioning is executed in the PM 10C. In the meantime, the number of processed substrates in the PM 10D reaches 500 (M≥N).

The sections 1 to 7 are steps for obtaining the state in which the number of substrates that are processed in each of the PMs 10 in the simultaneous use state of all processing chambers does not exceed 7 by repeating the processing of substrates W and the conditioning in the PMs 10 based on the fourth rule.

The sections 8 to 15 and 16 to 23 show the state in which the number of substrates that are processed in each of the PMs 10 in the simultaneous use state of all processing chambers which is automatically realized by the control unit 70 does not exceed 7. Since the number of substrates that are processed in each of the PMs 10 in the simultaneous state of all processing chambers does not exceed 7, the transfer of the substrate to the other PMs 10 by the first transfer unit 21 and the second transfer unit 25 is flexible. Accordingly, the substrates W can be efficiently processed with a high throughput without an idle time in the PMs 10. The sections after the section 16 are repeated the same as the sections 8 to 15.

As described above, by repeating the processing of substrates W and the conditioning in the PMs 10 under the fourth rule, it is possible to automatically obtain the state where the number of substrates that are processed in each of the PMs 10 in the simultaneous use state of all processing chambers does not exceed 25/n (here, rounded up after decimal point) under the control of the control unit 70. Accordingly, the throughput of processing the substrates W in the substrate processing system 1 can be considerably improved.

The other configurations, operations and effects in the present embodiment are the same as those of the first embodiment. Further, the substrate processing method of the present embodiment may include the same pre-coating method as that of the first embodiment. In other words, the control unit 70 sets the variable reference value Q and sets a period of cycle of executing the short-time pre-coating depending on whether or not the accumulated number M of processed substrates W is equal to or smaller than the reference value Q. Therefore, while the pre-coating film in the processing chamber 30 is relatively stable, i.e., while the accumulated number M of processed substrates W is small, the frequency of pre-coating can be decreased by increasing the interval of pre-coating. Accordingly, it is possible to reduce time required for pre-coating and improve a throughput in the substrate processing system 1, compared to the case of executing the short-time pre-coating between conditionings at a regular cycle.

In the present embodiment, the throughput in the substrate processing system 1 can be considerably improved by combining the pre-coating method and the conditioning method for obtaining the state in which the number of substrates that are processed in each of the PMs 10 in the simultaneous use state of all processing chambers does not exceed 25/n (here, rounded up after decimal point).

In the first and the second embodiment, the substrate processing system 1 including four PMs 10A to 10D adjacent to the vacuum-side transfer chamber 3 has been described as an example. However, the present invention may be applied to a substrate processing system including cluster tools of different structures as long as a plurality of processing chambers is provided.

Although the embodiments of the present invention have been described as examples in detail, the present invention can be variously modified without being limited to the above embodiments.

For example, in the above embodiments, the execution timing of pre-coating or conditioning is determined by accumulating the number of processed substrates W. However, the execution timing of pre-coating or conditioning may be determined by accumulating a film thickness of a thin film formed on the surface of the substrate W.

The present invention can also be applied to a processing system for performing atmospheric transfer.

Further, the present invention may be applied to a substrate processing system for processing a ceramic substrate, a large-size glass substrate for use in, e.g., a liquid crystal display, an organic EL display or the like.

While the invention has been shown and described with respect to the embodiments, the present invention is not limited thereto. It will be understood by those skilled in the art that various changes and modifications may be made without departing from the scope of the invention as defined in the following claims.

What is claimed is:

1. A substrate processing system for sequentially processing a plurality of substrates, comprising:
   a plurality of processing chambers configured to perform a process on the substrates;
   a transfer unit configured to transfer the substrates to the processing chambers; and
   a control unit configured to control the processing chambers and the transfer unit, wherein the control unit includes:
   a transfer control unit configured to control an operation of the transfer unit;
   a transfer order setting unit configured to set a transfer order of substrates to the processing chambers;
   an accumulation unit for accumulating a film thickness of a formed thin film or the number of processed substrates after completion of previous cleaning or previous pre-coating in each of the processing chambers;
   a processing chamber priority determination unit for determining priority of processing the substrates in the processing chambers based on predetermined rules; and
   an execution instruction unit for executing conditioning in each of the processing chambers,
   wherein the control unit prevents the substrates from being simultaneously processed in all processing chambers during one cycle of executing conditioning once in each of the processing chambers.

2. The substrate processing system of claim 1, wherein, on the assumption that the number of processing chambers usable in the substrate processing system is n, where n is a positive integer, and a set value of the number of substrates processed between completion of previous conditioning and start of next conditioning in each of the processing chambers is N, where N is a positive integer, the control unit controls time for conditioning in one of the processing chambers and time for transferring one substrate to each of the other processing chambers by the transfer unit such that the number P of substrates processed in each of the other processing chambers while the conditioning is being executed in the one processing chamber satisfies $P=N/(n-1)$, which is rounded up or down after decimal point.

3. The substrate processing system of claim 2, wherein the processing chamber includes a first, a second, a third and a fourth processing chamber that are in a usable state; and
   the processing chamber priority determination unit realizes a state in which the conditioning is executed in any one of the processing chambers and the substrates are processed in the other processing chambers without overlapping the conditioning in the processing chambers by repeating a sequence of determining the one processing chamber for processing the substrates based on a first rule, a second rule and a third rule:
   the first rule is that, when the accumulated number of substrates processed in the processing chamber, which is counted by the accumulation unit and determined to be the third in a descending order among the accumulated numbers of substrates processed in the first, the second, the third and the fourth processing chamber, is smaller than $N\times 3/6$, which is rounded up after decimal point, the processing is performed by using the processing chambers having the first, the second and the third accumulated number of processed substrates in the descending order;
   the second rule is that, when the accumulated number of substrates processed in the processing chamber, which is counted by the accumulation unit and determined to be the second in the descending order among the accumulated numbers of substrates processed in the first, the second, the third and the fourth processing chamber, is smaller than $N\times 3/6$, which is rounded up after decimal point, the processing is performed by using the processing chambers having the first, the second and the fourth accumulated number of processed substrates in the descending order; and
   the third rule is that, when the first rule and the second rule are not applied, the processing is performed by using processing chambers having the first, the third and the fourth accumulated number of processed substrates in the descending order which are counted by the accumulation unit,
   wherein the first rule, the second rule and the third rule are applied in that order, and when the accumulated number of processed substrates is the same in each of the processing chambers, the rules are applied to the first, the second, the third and the fourth processing chamber in that order.

4. The substrate processing system of claim 1, wherein the control unit further includes:
   a conditioning execution instruction unit for executing pre-coating in the processing chambers; and
   a pre-coating selection unit for selecting a type of the pre-coating,
   wherein the pre-coating selection unit selects, when the accumulated number of processed substrates which is counted by the accumulation unit between completion of previous conditioning and start of next conditioning in each of the processing chambers is equal to or smaller than a predetermined reference value, short-time pre-coating of a long cycle in which the short-time pre-coating is executed in the processing chamber whenever "a" number of substrates are processed, and selects, when the accumulated number of processed substrates exceeds the predetermined reference value, short-time pre-coating of a short cycle in which the short-time pre-coating is executed in the processing chamber whenever "b" number of substrates are processed, "b" being smaller than "a".

5. The substrate processing system of claim 2, wherein the control unit further includes:
   a conditioning execution instruction unit for executing pre-coating in the processing chambers; and
   a pre-coating selection unit for selecting a type of the pre-coating,
   wherein the pre-coating selection unit selects, when the accumulated number of processed substrates which is counted by the accumulation unit between completion of previous conditioning and start of next conditioning in each of the processing chambers is equal to or smaller than a predetermined reference value, short-time pre-coating of a long cycle in which the short-time pre-coating is executed in the processing chamber whenever "a" number of substrates are processed, and selects, when the accumulated number of processed substrates exceeds the predetermined reference value, short-time pre-coating of a short cycle in which the short-time pre-coating is executed in the processing chamber whenever "b" number of substrates are processed, "b" being smaller than "a".

6. The substrate processing system of claim 3, wherein the control unit further includes:
a conditioning execution instruction unit for executing pre-coating in the processing chambers; and
a pre-coating selection unit for selecting a type of the pre-coating,
wherein the pre-coating selection unit selects, when the accumulated number of processed substrates which is counted by the accumulation unit between completion of previous conditioning and start of next conditioning in each of the processing chambers is equal to or smaller than a predetermined reference value, short-time pre-coating of a long cycle in which the short-time pre-coating is executed in the processing chamber whenever "a" number of substrates are processed, and selects, when the accumulated number of processed substrates exceeds the predetermined reference value, short-time pre-coating of a short cycle in which the short-time pre-coating is executed in the processing chamber whenever "b" number of substrates are processed, "b" being smaller than "a".

7. A substrate processing system for sequentially processing a plurality of substrates, comprising:
a plurality of processing chambers configured to perform a process on the substrates;
a transfer unit configured to transfer the substrates to the processing chambers; and
a control unit configured to control the processing chambers and the transfer unit,
wherein the control unit includes:
a transfer control unit configured to control an operation of the transfer unit;
a transfer order setting unit configured to set a transfer order of substrates to the processing chambers;
an accumulation unit for accumulating a film thickness of a formed thin film or the number of processed substrates after completion of previous cleaning or previous pre-coating in each of the processing chambers;
a processing chamber priority determination unit for determining priority of processing the substrates in the processing chambers based on predetermined rules; and
an execution instruction unit for executing conditioning in each of the processing chambers,
wherein, on the assumption that the number of processing chambers usable in the substrate processing system is n, where n is a positive integer, and a maximum number of substrates contained in one lot is 25, the control unit performs control such that the number of substrates that are processed in each of the processing chambers in the simultaneous use state of all processing chambers does not exceed 25/n, which is rounded up after decimal point, during one cycle of executing conditioning once in each of the processing chambers.

8. The substrate processing system of claim 7, wherein, on the assumption that a set value of the number of substrates processed between completion of previous conditioning and start of next condition in each of the processing chambers is N, where N is a positive integer, the control unit controls time for cleaning one of the processing chambers and time for transferring one substrate to each of the other processing chambers by the transfer unit such that the number P of processed substrates in each of the processing chambers while the conditioning is being executed in the one processing chamber satisfies P=N/(n−1), which is rounded up or down after decimal point.

9. The substrate processing system of claim 8, wherein the processing chamber includes a first, a second, a third and a fourth processing chamber that are in a usable state, and
the state in which the number of substrates that are processed in each of the processing chambers while the substrates are simultaneously processed in all processing chambers does not exceed 25/n, which is rounded up after decimal point, is obtained during one cycle of executing the conditioning once in each of the processing chambers by repeating a sequence of determining one of the processing chambers where the conditioning will be executed based on a following rule:
in the case of processing the substrates by using all the processing chambers usable in the substrate processing system, the conditioning is executed in one of the processing chambers having the largest accumulated number of processed substrates after completion of the processing of one lot, but when the accumulated number of processed substrates after completion of the processing of one lot is the same in each of the processing chambers, the rule is applied to the first, the second, the third and the fourth processing chamber in that order.

10. The substrate processing system of claim 7, wherein the control unit further includes:
a conditioning execution instruction unit for executing pre-coating in the processing chambers; and
a pre-coating selection unit for selecting a type of the pre-coating,
wherein the pre-coating selection unit selects, when the accumulated number of processed substrates counted by the accumulation unit between completion of previous conditioning and start of next conditioning in each of the processing chambers is equal to or smaller than a predetermined reference value, short-time pre-coating of a long-cycle in which the short-time pre-coating is executed in the processing chamber whenever "a" number of substrates are processed, and selects, when the accumulated number of processed substrates exceeds the predetermined reference value, short-time pre-coating of a short-cycle in which the short-time pre-coating is executed in the processing chamber whenever "b" number of substrates are processed, "b" being smaller than "a".

11. The substrate processing system of claim 8, wherein the control unit further includes:
a conditioning execution instruction unit for executing pre-coating in the processing chambers; and
a pre-coating selection unit for selecting a type of the pre-coating,
wherein the pre-coating selection unit selects, when the accumulated number of processed substrates counted by the accumulation unit between completion of previous conditioning and start of next conditioning in each of the processing chambers is equal to or smaller than a predetermined reference value, short-time pre-coating of a long-cycle in which the short-time pre-coating is executed in the processing chamber whenever "a" number of substrates are processed, and selects, when the accumulated number of processed substrates exceeds the predetermined reference value, short-time pre-coating of a short-cycle in which the short-time pre-coating is executed in the processing chamber whenever "b" number of substrates are processed, "b" being smaller than "a".

12. The substrate processing system of claim 9, wherein the control unit further includes:
a conditioning execution instruction unit for executing pre-coating in the processing chambers; and
a pre-coating selection unit for selecting a type of the pre-coating,
wherein the pre-coating selection unit selects, when the accumulated number of processed substrates counted by the accumulation unit between completion of previous conditioning and start of next conditioning in each of the processing chambers is equal to or smaller than a predetermined reference value, short-time pre-coating of a long-cycle in which the short-time pre-coating is executed in the processing chamber whenever "a" number of substrates are processed, and selects, when the accumulated number of processed substrates exceeds the predetermined reference value, short-time pre-coating of a short-cycle in which the short-time pre-coating is executed in the processing chamber whenever "b" number of substrates are processed, "b" being smaller than "a".

* * * * *